US009041114B2

(12) United States Patent
Ide

(10) Patent No.: US 9,041,114 B2
(45) Date of Patent: May 26, 2015

(54) CONTACT PLUG PENETRATING A METALLIC TRANSISTOR

(71) Applicant: KABUSHIKI KAISHA TOSHIBA, Minato-Ku (JP)

(72) Inventor: Kenichi Ide, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/015,184

(22) Filed: Aug. 30, 2013

(65) Prior Publication Data

US 2014/0339613 A1 Nov. 20, 2014

Related U.S. Application Data

(60) Provisional application No. 61/825,232, filed on May 20, 2013.

(51) Int. Cl.

| | |
|---|---|
| ***H01L 29/40*** | (2006.01) |
| ***H01L 29/78*** | (2006.01) |
| ***H01L 29/49*** | (2006.01) |
| ***H01L 21/28*** | (2006.01) |
| ***H01L 23/528*** | (2006.01) |
| ***H01L 23/522*** | (2006.01) |
| ***H01L 23/532*** | (2006.01) |

(52) U.S. Cl.

CPC ...... *H01L 29/4941* (2013.01); *H01L 21/28052* (2013.01); *H01L 23/528* (2013.01); *H01L 23/5226* (2013.01); *H01L 23/53209* (2013.01)

(58) Field of Classification Search

CPC .............. H01L 23/5226; H01L 23/528; H01L 23/53209

USPC .......... 438/625, 627, 629; 257/773, 774, 364, 257/412, 413

See application file for complete search history.

(56) References Cited

U.S. PATENT DOCUMENTS

| | | | | |
|---|---|---|---|---|
| 5,998,873 A * | 12/1999 | Blair et al. | .................... | 257/766 |
| 6,333,548 B1 | 12/2001 | Yamane et al. | | |
| 7,755,131 B2 | 7/2010 | Kinoshita | | |
| 7,863,123 B2 * | 1/2011 | Bu et al. | .................... | 438/197 |
| 8,004,046 B2 * | 8/2011 | Sengoku | .................... | 257/369 |
| 2005/0186792 A1 * | 8/2005 | Takahashi | .................... | 438/673 |
| 2006/0192258 A1 * | 8/2006 | Tsuchiya et al. | .............. | 257/412 |
| 2007/0202643 A1 * | 8/2007 | Srivastava | .................... | 438/197 |
| 2007/0257302 A1 * | 11/2007 | Kang et al. | .................... | 257/315 |
| 2008/0191270 A1 | 8/2008 | Kinoshita | | |

(Continued)

FOREIGN PATENT DOCUMENTS

| | | |
|---|---|---|
| JP | 10-32246 | 2/1998 |
| JP | 2008-198723 | 8/2008 |
| JP | 2009-218421 | 9/2009 |

(Continued)

*Primary Examiner* — Kevin Parendo

(74) *Attorney, Agent, or Firm* — Oblon, McClelland, Maier & Neustadt, L.L.P.

(57) ABSTRACT

In one embodiment, a semiconductor device includes a semiconductor substrate, and a gate insulator arranged on the semiconductor substrate. The device further includes a gate electrode including a semiconductor layer and a metal layer which are sequentially arranged on the gate insulator. The device further includes a contact plug arranged on the gate electrode to penetrate the metal layer, and having a bottom surface at a level lower than an upper surface of the semiconductor layer.

8 Claims, 6 Drawing Sheets

(56) References Cited

U.S. PATENT DOCUMENTS

2013/0037876 A1 2/2013 Omoto
2014/0071759 A1* 3/2014 Nomura et al. .......... 365/185.17

FOREIGN PATENT DOCUMENTS

JP 2010-225993 10/2010
JP 2013-38341 2/2013

* cited by examiner

CONTACT PLUG PENETRATING A METALLIC TRANSISTOR

CROSS REFERENCE TO RELATED APPLICATION

This application is based upon and claims the benefit of priority from the prior U.S. Provisional Patent Application No. 61/825,232 filed on May 20, 2013, the entire contents of which are incorporated herein by reference.

FIELD

Embodiments described herein relate to a semiconductor device and a method of manufacturing the same.

BACKGROUND

When a gate electrode of a select transistor or a peripheral transistor in an NAND memory is formed of polysilicon layers and metal layers and a contact plug is formed on the gate electrode, there is a problem that contact resistance between the bottom end of the contact plug and the bottom end of the gate electrode becomes large. This is because interface resistance between the polysilicon layers and between a polysilicon layer and a metal layer are large and the interface resistance affects the contact resistance. Furthermore, when the interface area becomes smaller as the NAND memory is made finer, the interface resistance further becomes larger.

DETAILED DESCRIPTION

Embodiments will now be explained with reference to the accompanying drawings.

In one embodiment, a semiconductor device includes a semiconductor substrate, and a gate insulator arranged on the semiconductor substrate. The device further includes a gate electrode including a semiconductor layer and a metal layer which are sequentially arranged on the gate insulator. The device further includes a contact plug arranged on the gate electrode to penetrate the metal layer, and having a bottom surface at a level lower than an upper surface of the semiconductor layer.

(First Embodiment)

Figure 1:
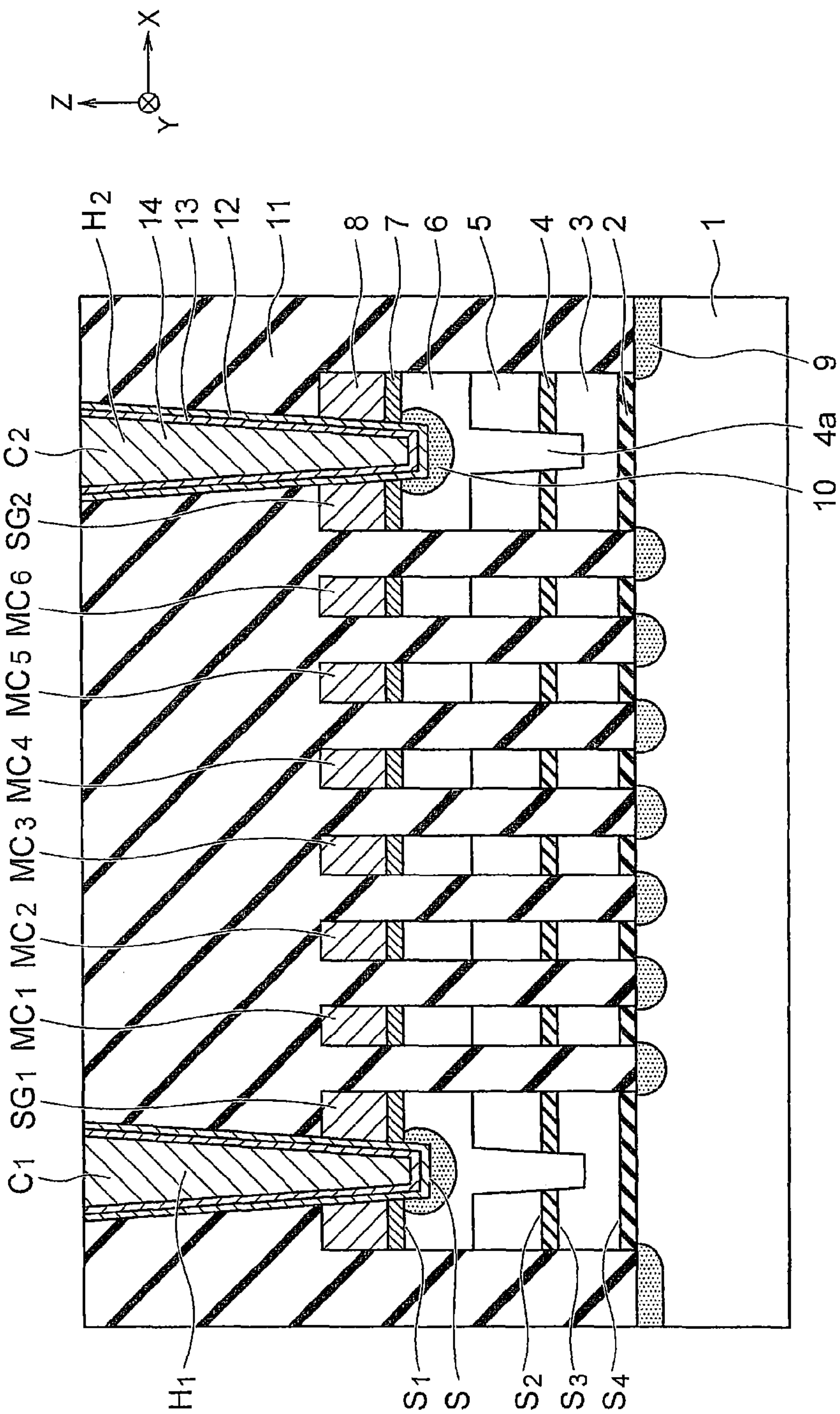
FIG. 1 is a cross-sectional view illustrating a structure of a semiconductor device of a first embodiment.

FIG. 1 is a cross-sectional view illustrating a structure of a semiconductor device of a first embodiment. FIG. 1 illustrates a cross-section of an NAND string forming an NAND memory which is an example of the semiconductor device of the present embodiment.

The semiconductor device in FIG. 1 includes a semiconductor substrate 1, a first insulating layer 2, a first polysilicon layer 3 as an example of a first semiconductor layer, a second insulating layer 4, second and third polysilicon layers 5 and 6 as an example of at least one second semiconductor layer, first and second metal layers 7 and 8, diffusion layers 9, silicide layers 10, an inter layer dielectric 11, a metal layer 12, a barrier metal layer 13 and a plug material layer 14.

A stack layer including the first, second and third polysilicon layers 3, 5 and 6 are an example of a semiconductor layer of the disclosure. A stack layer including the first and second metal layers 7 and 8 are an example of a metal layer of the disclosure. The second insulating layer 4 is an example of an insulating layer of the disclosure.

FIG. 1 further illustrates cell transistors $MC_1$ to $MC_6$ and select transistors $SG_1$ and $SG_2$ formed on the semiconductor substrate 1, contact holes $H_1$ and $H_2$ formed on the select transistors $SG_1$ and $SG_2$ in the inter layer dielectric 11, and contact plugs $C_1$ and $C_2$ embedded in the contact holes $H_1$ and $H_2$.

The semiconductor substrate 1 is, for example, a silicon (Si) substrate. FIG. 1 illustrates X and Y directions which are parallel to a main surface of the semiconductor substrate 1 and perpendicular to each other, and a Z direction perpendicular to the main surface of the semiconductor substrate 1. In the present specification, the +Z direction is treated as the upward direction, and the −Z direction is treated as the downward direction. For example, the positional relationship between the semiconductor substrate 1 and inter layer dielectric 11 is represented that the semiconductor substrate 1 is located below the inter layer dielectric 11.

The first insulating layer 2, the first polysilicon layer 3, the second insulating layer 4, the second polysilicon layer 5, the third polysilicon layer 6, the first metal layer 7 and the second metal layer 8 are sequentially formed on the semiconductor substrate 1. The first and second insulating layers 2 and 4 are, for example, silicon oxide layers. The first metal layer 7 is, for example, a tungsten nitride (WN) layer, and functions as a barrier metal layer. The second metal layer 8 is, for example, a tungsten (W) layer.

Each cell transistor $MC_1$ to $MC_6$ includes a gate insulator including the first insulating layer 2, a floating gate including the first polysilicon layer 3, an intergate insulator including the second insulating layer 4, and a control gate including the second and third polysilicon layers 5 and 6 and the first and second metal layers 7 and 8. The floating gate and the control gate of each cell transistor $MC_1$ to $MC_6$ are electrically insulated from each other with the intergate insulator.

Each select transistor $SG_1$ and $SG_2$ includes a gate insulator including the first insulating layer 2, and a gate electrode including the first to third polysilicon layers 3, 5 and 6 and the first and second metal layers 7 and 8. The first polysilicon layer 3 and the second polysilicon layer 5 of each select transistor $SG_1$ and $SG_2$ are electrically connected to each other through an opening **4*a* provided in the second insulating layer 4**.

The diffusion layers 9 are formed in the semiconductor substrate 1 to sandwich the cell transistors $MC_1$ to $MC_6$ and the select transistors $SG_1$ and $SG_2$. The inter layer dielectric 11 is formed on the semiconductor substrate 1 to cover the cell transistors $MC_1$ to $MC_6$ and the select transistors $SG_1$ and $SG_2$. The inter layer dielectric 11 is, for example, a stack layer including a silicon oxide layer and a silicon nitride layer.

The contact plugs $C_1$ and $C_2$ are respectively formed on the gate electrodes of the select transistors $SG_1$ and $SG_2$ to penetrate the first and second metal layers 7 and 8. Each contact plug $C_1$ and $C_2$ has a bottom surface S at a level lower than an upper surface $S_1$ of the third polysilicon layer 6 and higher than an upper surface $S_2$ of the second insulating layer 4.

The contact plugs $C_1$ and $C_2$ include the metal layer 12 formed on bottom and side surfaces of the contact holes $H_1$ and $H_2$, the barrier metal layer 13 formed on the bottom and side surfaces of the contact holes $H_1$ and $H_2$ via the metal layer 12, and the plug material layer 14 formed on the barrier metal layer 13. The metal layer 12 is, for example, a titanium (Ti) layer. The barrier metal layer 13 is, for example, a titanium nitride (TiN) layer. The plug material layer 14 is, for example, a tungsten (W) layer.

Each silicide layer 10 is formed on a surface of the third polysilicon layer 6 of each select transistor $SG_1$ and $SG_2$, and is in contact with the bottom surface S and a portion of the side surface of each contact plug $C_1$ and $C_2$. The silicide layers 10 of the present embodiment are formed by diffusing Ti atoms in the metal layer 12 to the surface of the third polysilicon layer 6. Therefore, the silicide layers 10 of the present embodiment are titanium silicide layers. The metal layers 12 may be formed of such metal atoms other than Ti atoms that can form the silicide layers 10.

(1) Effects of Semiconductor Device of First Embodiment

Continuously referring to FIG. 1, effects of the semiconductor device of the first embodiment will be described.

As described above, each contact plug $C_1$ and $C_2$ of the present embodiment penetrates the first and second metal layers 7 and 8, and has the bottom surface S at a level lower than the upper surface $S_1$ of the third polysilicon layer 6.

Therefore, according to the present embodiment, interface resistance between the polysilicon layer 6 and metal layer 7 can be suppressed from affecting contact resistance of the contact plugs $C_1$ and $C_2$.

Accordingly, according to the present embodiment, the contact resistance of the contact plugs $C_1$ and $C_2$ can be reduced in the case where the gate electrode of each select transistor $SG_1$ and $SG_2$ has the structure of including the polysilicon layers 3, 5 and 6 and the metal layers 7 and 8 (poly-metal structure).

Moreover, each select transistor $SG_1$ and $SG_2$ of the present embodiment includes a silicide layer 10 on the surface of the third polysilicon layer 6 to contact the bottom surface S of each contact plug $C_1$ and $C_2$. Therefore, according to the present embodiment, the silicide layer 10 can further reduce the contact resistance.

Moreover, the metal layer 12 of the present embodiment is formed of metal atoms which can form the silicide layer 10. Therefore, according to the present embodiment, the silicide layer 10 can be formed by diffusing the metal atoms in the metal layer 12 to the surface of the third polysilicon layer 6.

The structures of the gate electrodes and the contact plugs $C_1$ and $C_2$ of the present embodiment can also be applied to peripheral transistors as well as the select transistors $SG_1$ and $SG_2$.

(2) Method of Manufacturing Semiconductor Device of First Embodiment

Referring to FIGS. 2A to 4C, a method of manufacturing the semiconductor device of the first embodiment will be described.

FIGS. 2A to 4C are cross-sectional views illustrating the method of manufacturing the semiconductor device of the first embodiment.

Figure 2A:
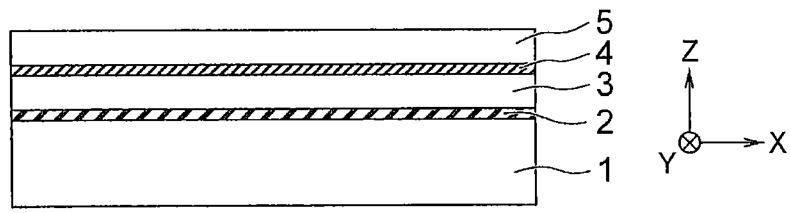
FIGS. 2A to 4C are cross-sectional views illustrating a method of manufacturing the semiconductor device of the first embodiment.

First, as illustrated in FIG. 2A, the first insulating layer 2, the first polysilicon layer 3, the second insulating layer 4, and the second polysilicon layer 5 are sequentially formed on the entire surface of the semiconductor substrate 1. At this stage, a process of forming shallow trench isolations (STIs) is performed between the process of forming the first polysilicon layer 3 and the process of forming the second insulating layer 4.

Figure 2B:
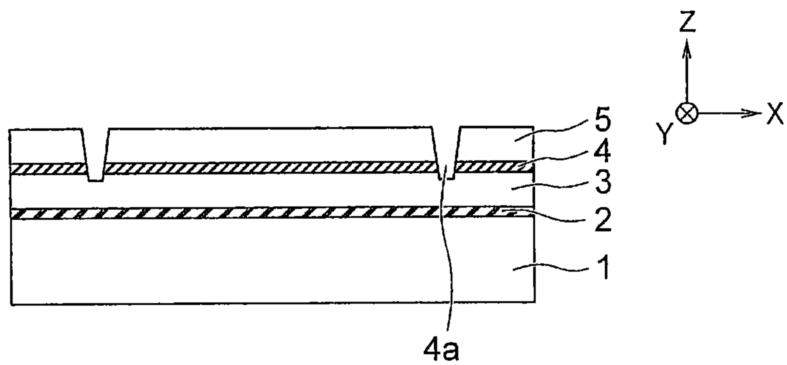

Next, as illustrated in FIG. 2B, trenches which penetrate the second polysilicon layer 5 and the second insulating layer 4 and have bottom surfaces in the first polysilicon layer 3 are formed by lithography and etching. As a result, openings 4*a* for the select transistors $SG_1$ and $SG_2$ are formed in the second insulating layer 4. The trenches are, for example, formed to have shapes extending in the Y direction.

Figure 2C:
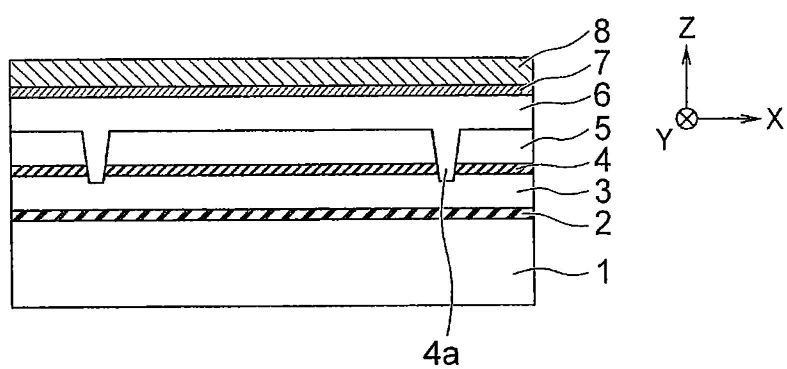

Next, as illustrated in FIG. 2C, the third polysilicon layer 6, the first metal layer 7, and the second metal layer 8 are sequentially formed on the entire surface of the semiconductor substrate 1. Portions of the third polysilicon layer 6 are embedded in the above-mentioned trenches.

Figure 3A:
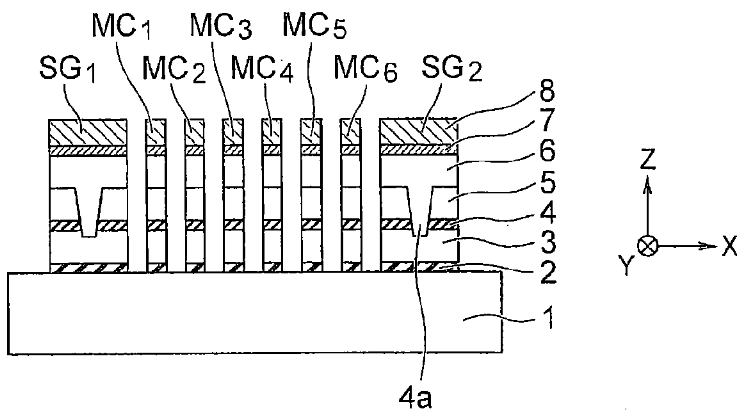

Next, as illustrated in FIG. 3A, a gate process is performed by lithography and reactive ion etching (RIE). As a result, the gate structures of the cell transistors $MC_1$ to $MC_6$ and the select transistors $SG_1$ and $SG_2$ are formed on the semiconductor substrate 1. The gate process may be performed by forming a hard mask layer on the second metal layer 8.

Figure 3B:
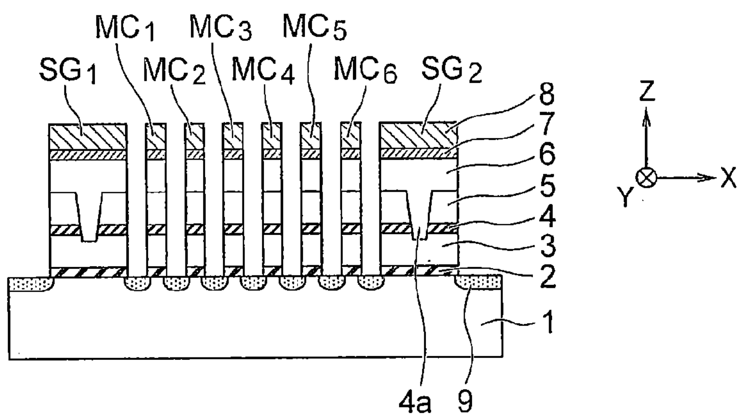

Next, as illustrated in FIG. 3B, ion implantation into the semiconductor substrate 1 is performed. As a result, the diffusion layers 9 are formed in the semiconductor substrate 1 after a thermal process and the like performed after the ion implantation.

Figure 3C:
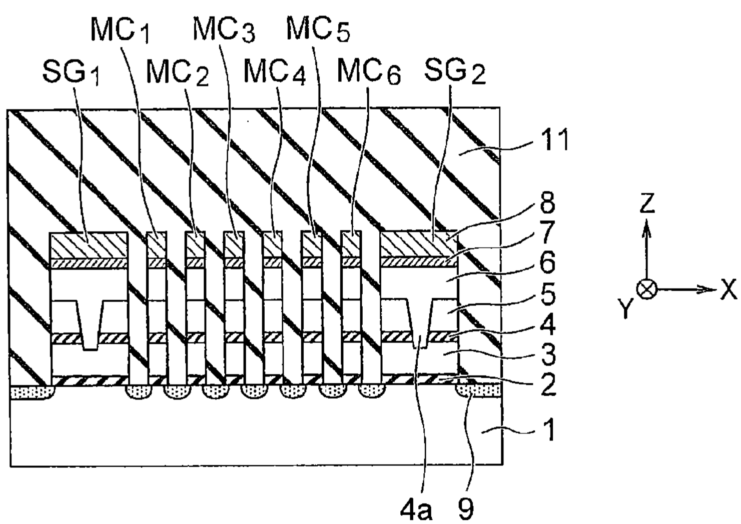

Next, as illustrated in FIG. 3C, the inter layer dielectric 11 covering the cell transistors $MC_1$ to $MC_6$ and the select transistors $SG_1$ and $SG_2$ is formed on the semiconductor substrate 1. At this time, air gaps which are regions not including the inter layer dielectric 11 may be formed between the cell transistors $MC_1$ to $MC_6$ and between the cell transistors $MC_1$, $MC_6$ and the select transistors $SG_1$, $SG_2$.

Figure 4A:
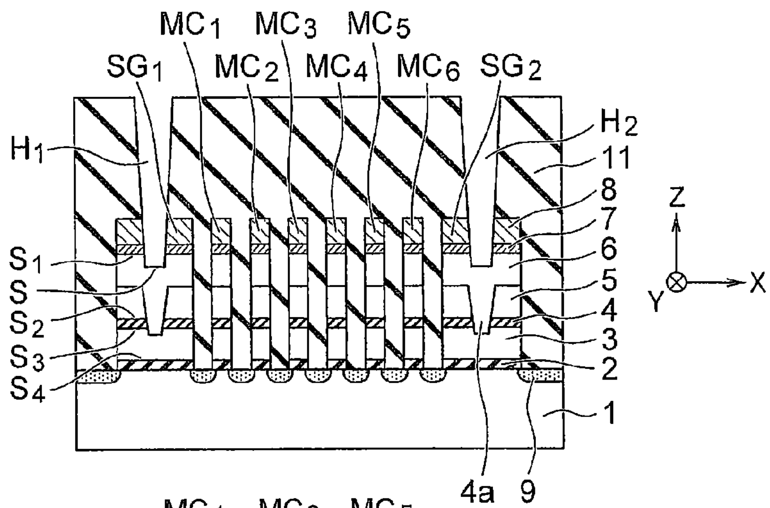

Next, as illustrated in FIG. 4A, the contact holes $H_1$ and $H_2$ penetrating the first and second metal layers 7 and 8 are formed on the select transistors $SG_1$ and $SG_2$ in the inter layer dielectric 11 by lithography and etching. Each contact hole $H_1$ and $H_2$ is formed to have the bottom surface S at a level lower than the upper surface $S_1$ of the third polysilicon layer 6 and higher than the upper surface $S_2$ of the second insulating layer 4. Timing of ending the etching in this process is, for example, controlled by counting the etching time to perform the etching.

Figure 4B:
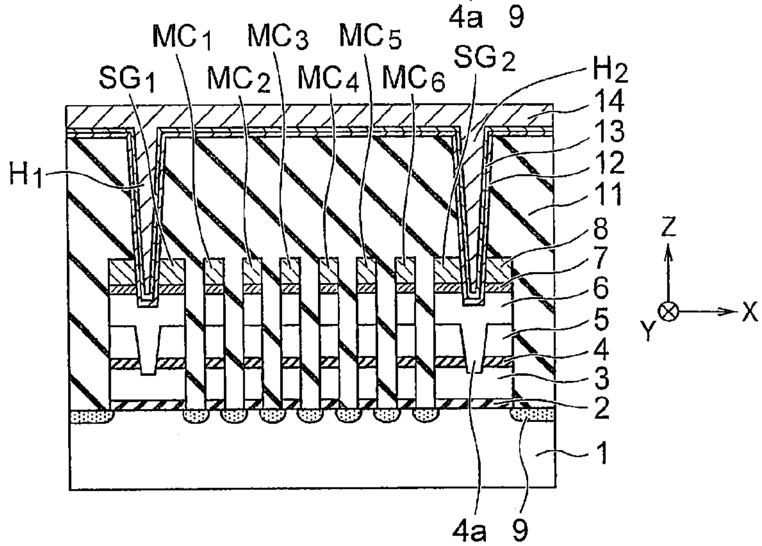

Next, as illustrated in FIG. 4B, the metal layer 12, the barrier metal layer 13, and the plug material layer 14 are sequentially formed on the entire surface of the semiconductor substrate 1.

Figure 4C:
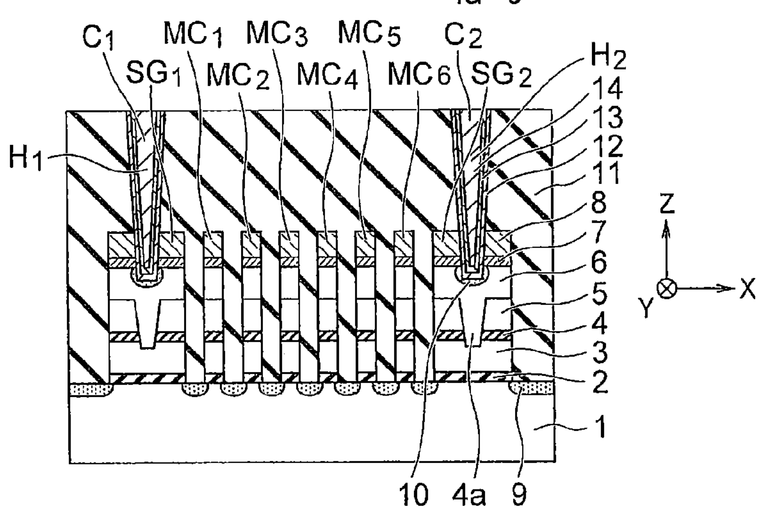

Next, as illustrated in FIG. 4C, the surface of the plug material layer 14 and the like is planarized until it reaches the surface of the inter layer dielectric 11 by chemical mechanical polishing (CMP). As a result, the contact plugs $C_1$ and $C_2$ are formed in the contact holes $H_1$ and $H_2$.

The silicide layers 10 are formed by diffusing Ti atoms in the metal layer 12 to the surface of the third polysilicon layer 6 by the action in forming the metal layer 12 and the action of the thermal process thereafter.

As described above, each contact plug $C_1$ and $C_2$ of the present embodiment is formed to penetrate the first and second metal layers 7 and 8 and to have the bottom surface S at a level lower than the upper surface $S_1$ of the third polysilicon layer 6. Therefore, according to the present embodiment, an influence of the interface resistance on the contact resistance of the contact plugs $C_1$ and $C_2$ can be reduced, and thereby the contact resistance can be reduced.

(Second Embodiment)

Figure 5:
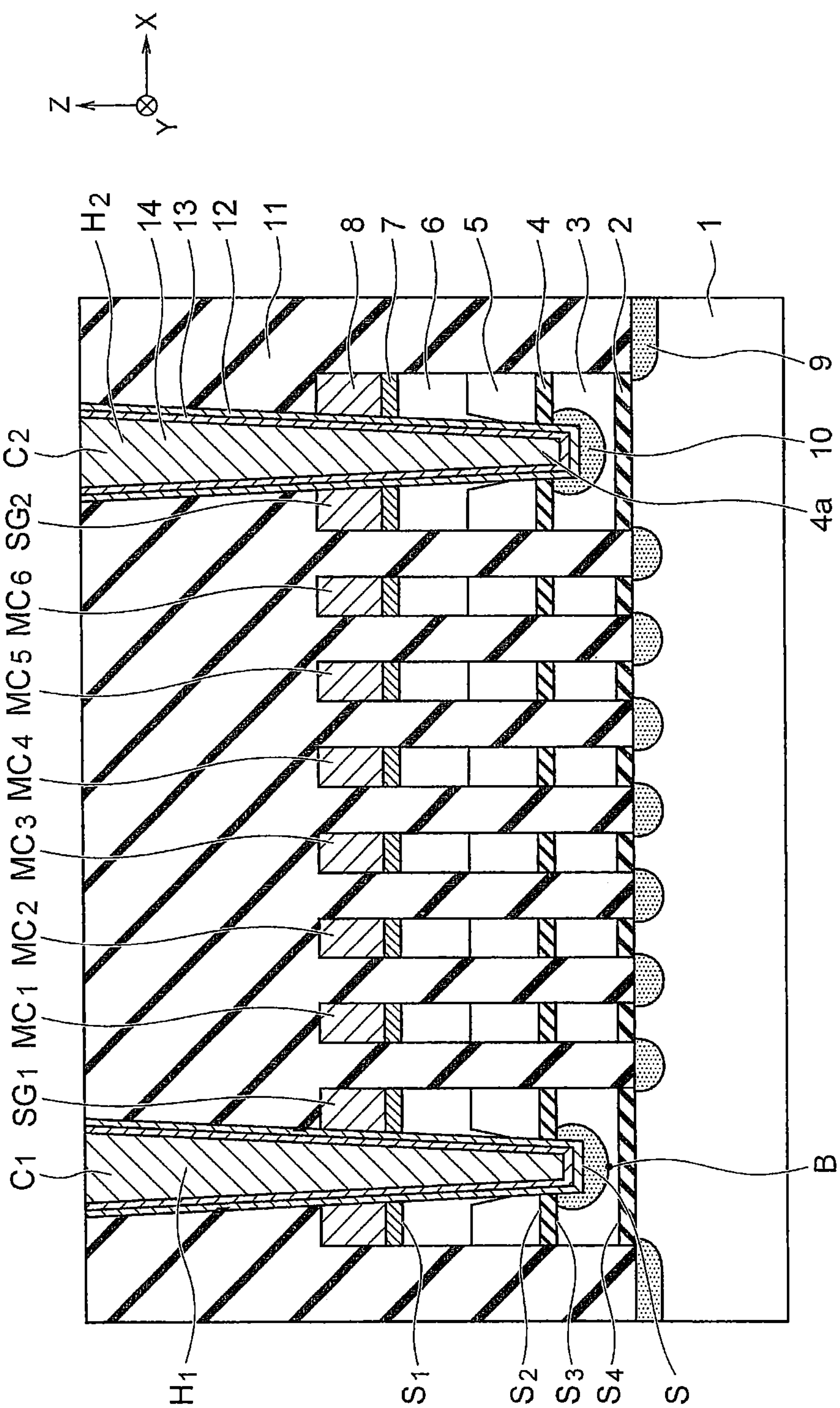
FIG. 5 is a cross-sectional view illustrating a structure of a semiconductor device of a second embodiment.

FIG. 5 is a cross-sectional view illustrating a structure of a semiconductor device of a second embodiment.

Each contact plug $C_1$ and $C_2$ of the first embodiment has the bottom surface S at a level higher than the upper surface $S_2$ of the second insulating layer 4 (FIG. 1). As a result, the silicide layers 10 of the first embodiment are formed on the surface of the third polysilicon layer 6 (FIG. 1).

On the contrary, each contact plug $C_1$ and $C_2$ of the second embodiment has the bottom surface S at a level lower than a lower surface $S_3$ of the second insulating layer 4 (FIG. 5). As a result, the silicide layers 10 of the second embodiment are formed on the surface of the first polysilicon layer 3 (FIG. 5).

Compared with the structure of the second embodiment, the structure of the first embodiment has a merit that the aspect ratio of the contact holes $H_1$ and $H_2$ is small and that the contact holes $H_1$ and $H_2$ are easy to be formed.

On the other hand, compared with the structure of the first embodiment, the structure of the second embodiment has a merit that the influence of the interface resistance on the contact resistance of the contact plugs $C_1$ and $C_2$ is small and that the contact resistance can be further reduced. This is because the contact plugs $C_1$ and $C_2$ of the second embodiment penetrate the interfaces between the polysilicon layers 3, 5 and 6 as well as the interface between the polysilicon layer 6 and the metal layer 7.

The contact plugs $C_1$ and $C_2$ of the second embodiment can be formed by making the bottom surfaces S of the contact holes $H_1$ and $H_2$ lower than the lower surface $S_3$ of the second insulating layer 4 in the process of FIG. 4A.

The silicide layers 10 are desirable not to contact the first insulating layer 2. This is because the silicide layers 10 have a risk of affecting the first insulating layer 2 disadvantageously. Therefore, a height of the lowermost end part B of the bottom surface of each silicide layer 10 of the present embodiment locates at a level higher than a height of an upper surface $S_4$ of the first insulating layer 2. The distance between the lowermost end part B and the upper surface $S_4$ is set, for example, to be 5 nm or more in order to suppress the disadvantageous influence of the silicide layers 10 on the first insulating layer 2.

(Third Embodiment)

Figure 6:
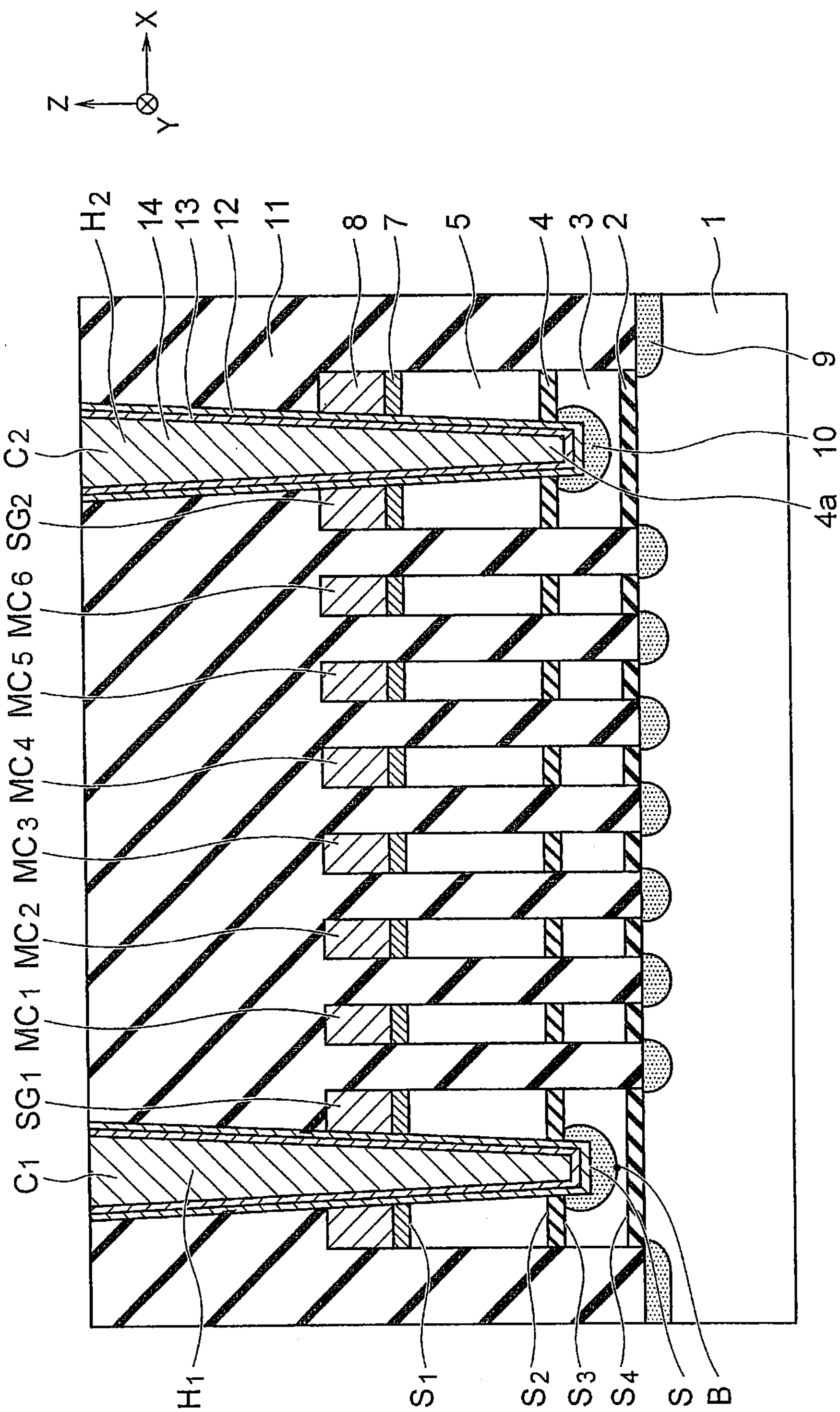
FIG. 6 is a cross-sectional view illustrating a structure of a semiconductor device of a third embodiment.

FIG. 6 is a cross-sectional view illustrating a structure of a semiconductor device of a third embodiment.

The semiconductor layer of the select transistors $SG_1$ and $SG_2$ of the present embodiment is formed only of the first and second polysilicon layers 3 and 5, and does not include the third polysilicon layer 6.

The semiconductor device of the present embodiment can be manufactured as follows. First, in the process of FIG. 2A, the thickness of the second polysilicon layer 5 is set to be approximately same as the total thickness of the second and third polysilicon layers 5 and 6 of the second embodiment. Second, the process of forming the trenches (openings 4*a*) illustrated in FIG. 2B, and the process of forming the third polysilicon layer 6 illustrated in FIG. 2C are omitted.

The openings 4*a* of the present embodiment are formed by forming the contact holes $H_1$ and $H_2$ to penetrate the second insulating layer 4 in the process of FIG. 4B. Therefore, according to the present embodiment, the process of forming the above-mentioned trenches and the process of forming the third polysilicon layer 6 can be omitted, and thereby manufacturing processes of the semiconductor device can be reduced.

Since the openings 4*a* of the present embodiment are formed by forming the contact holes $H_1$ and $H_2$, the cross-sectional shapes of the openings 4*a* of the present embodiment are same as the cross-sectional shapes of the contact holes $H_1$ and $H_2$ (contact plugs $C_1$ and $C_2$).

For example, when the cross-sectional shapes of the contact holes $H_1$ and $H_2$ at the same height as the openings 4*a* are circles, the cross-sectional shapes of the openings 4*a* are also circles with the identical size to the above circles. When the cross-sectional shapes of the contact holes $H_1$ and $H_2$ at the same height as the openings 4*a* are ellipses or ovals, the cross-sectional shapes of the openings 4*a* are also ellipses or ovals with the identical size of the above ellipses or ovals.

In the first to third embodiments, when the size of the openings 4*a* is too small, there can be a risk that electric resistance at the points of the openings 4*a* becomes high. This may be a problem in the third embodiment in which the openings 4*a* are formed by the contact process. In this case, the electric resistance at the points of the openings 4*a* may be reduced, for example, by setting the cross-sectional shapes of the contact holes $H_1$ and $H_2$ as the ellipses or the ovals not as the circles in order to make the size of the openings 4*a* larger. Alternatively, in a case where the cross-sectional shapes of the contact holes $H_1$ and $H_2$ is set into circles, the electric resistance at the points of the openings 4*a* may be reduced by making the diameter of the circles longer in order to make the size of the openings 4*a* larger.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
- a semiconductor substrate;
- a gate insulator arranged on the semiconductor substrate;
- a gate electrode including a semiconductor layer and a metal layer which are sequentially arranged on the gate insulator;
- a contact plug arranged on the gate electrode penetrating the metal layer, and having a bottom surface at a level lower than an upper surface of the semiconductor layer; and
- a silicide layer provided on a surface of the semiconductor layer and in contact with the bottom surface and a portion of a side surface of the contact plug.

2. The device of claim 1, wherein the contact plug comprises:
- a metal layer containing metal atoms which are same as metal atoms contained in the silicide layer;
- a barrier metal layer arranged on the metal layer; and
- a plug material layer arranged on the barrier metal layer.

3. The device of claim 1, wherein a height of a lowermost end part of a bottom surface of the silicide layer is higher than a height of an upper surface of the gate insulator.

4. The device of claim 1, wherein the semiconductor layer comprises:
- a first semiconductor layer arranged on the gate insulator; and
- at least one second semiconductor layer arranged on the first semiconductor layer via an insulating layer, and electrically connected to the first semiconductor layer through an opening provided in the insulating layer.

5. The device of claim 4, wherein the contact plug has the bottom surface at a level higher than an upper surface of the insulating layer.

6. The device of claim 4, wherein the contact plug has the bottom surface at a level lower than a lower surface of the insulating layer.

7. The device of claim 6, wherein a height of a lowermost end part of a bottom surface of the silicide layer is higher than a height of an upper surface of the gate insulator.

8. The device of claim 6, wherein a cross-sectional shape of the opening is same as a cross-sectional shape of the contact plug.

* * * * *